United States Patent
Tohyama

[19]

[11] Patent Number: 5,852,321

[45] Date of Patent: Dec. 22, 1998

[54] THERMAL TYPE INFRARED RADIATION SOLID STATE IMAGE PICK-UP DEVICE

[75] Inventor: Shigeru Tohyama, Tokyo, Japan

[73] Assignee: NEC Corporation, Tokyo, Japan

[21] Appl. No.: 810,138

[22] Filed: Feb. 25, 1997

[30] Foreign Application Priority Data

Mar. 7, 1996 [JP] Japan .................................. 8-049948

[51] Int. Cl.$^6$ ................................................ H01L 31/058
[52] U.S. Cl. .......................... 257/443; 257/222; 257/225; 257/226; 257/229; 257/444; 257/440; 257/446
[58] Field of Search ..................................... 257/440, 443, 257/444, 446, 469, 706, 707, 717, 718, 80–84, 222–227, 257, 258, 290–293, 433

[56] References Cited

U.S. PATENT DOCUMENTS 5,656,848 8/1997 Beratan et al. ......................... 257/446

OTHER PUBLICATIONS

R. A. Wood., "High–Performance Infrared Thermal Imaging with Monolithic Silicom Focal Planes Operating at Room Temperature", IEEE, (1993), pp. 8.1.1–8.1.3.

Primary Examiner—Tom Thomas
Assistant Examiner—Fetsum Abraham
Attorney, Agent, or Firm—Foley & Lardner

[57] ABSTRACT

A thermal type infrared radiation solid state image pick-up device includes a temperature-electrical signal converting function element and a heat isolation structural body supporting the temperature-electrical signal converting function element. The heat isolation structural body is formed of a silicon oxide or a silicon nitride in porous structure. Since the heat isolation structural body has porous structure, heat flowing out from the heat isolation structural body depends on an actual area derived by subtracting the area of the holes from the area of the cross-section of the leg (nominal cross section). On the other hand, the mechanical strength of the heat isolation structural body relies on the area of the cross section of the leg. Therefore, for obtaining the photo sensitivity equivalent to that of the conventional heat isolation structural body, the cross sectional area of the leg can be made greater to improve mechanical strength thereof.

8 Claims, 2 Drawing Sheets

THERMAL TYPE INFRARED RADIATION SOLID STATE IMAGE PICK-UP DEVICE

BACKGROUND OF THE INVENTION

1. Field of the Invention

The present invention relates generally to an infrared radiation solid state image pick-up device which converts a thermal image into an electrical signal. More specifically, the invention relates to an infrared radiation solid state image pick-up device which does not require cooling by a cooling means.

2. Description of the Related Art

An infrared radiation solid state image pick-up device is adapted to absorb an infrared radiation incident to an element in a photo receiving portion, converting a temperature variation caused by absorption of the infrared radiation into an electrical signal by a temperature-electrical signal converting function element formed in the photo receiving portion. Such thermal type infrared radiation solid state image pick-up device which does not require cooling by a cooling means, has been reported in R. A. Wood, IEEE IEDM Tech., Dig., 1993, pp. 175–177.

FIG. 1 is a block diagram showing a structure of typical thermal type infrared radiation solid state image pick-up device. A photo receiving portion 2 is formed with a heat isolation structural body 5 and a temperature-electric signal converting function element 4 formed on the heat isolation structural body 5 or buried therein. A plurality of photo receiving portions 2 are arranged in a matrix. On the other hand, each of the temperature-electric signal converting function element 4 has two terminals, in which one of the terminals is grounded and the other terminal is connected to a source of a vertical switch MOS transistor 6.

Also, for each row of the vertical switch MOS transistors 6, a clock line 8 is arranged. All of the gates of the vertical switch MOS transistors 6 arranged in one row are connected to one clock line 8. One end of all of the clock lines 8 are connected to a vertical scanning circuit 11. On the other hand, for each column of the vertical switch MOS transistors 6, a vertical signal line 9 is arranged. Thus, all of the drains of the vertical switch MOS transistors 6 arranged in one column are connected to one vertical signal line 9. One ends of all of the vertical signal lines 9 are respectively connected to a source of a horizontal switch MOS transistors 7. Gates of the horizontal switch MOS transistors 7 are connected to a horizontal scanning circuit 12. Drains of the horizontal switch MOS transistors 7 are connected to one horizontal signal line 10.

In the thermal-type infrared radiation solid state image pick-up device, when a particular photo receiving portion 2 absorbs the infrared radiation, the infrared radiation generates heat and temperature variation is caused in the portion 2. Then electrical properties, for example, electric resistance, electromotive force and quantity of electric charge and so forth of the temperature-electric signal converting function element 4 are varied by the temperature variation.

Next, on voltage is selectively applied to one clock line 8 by the vertical scanning circuit 11. Then, one row of the vertical switch MOS transistors 6 connected to the clock line 8 achieves an ON state. Subsequently, at this condition, when the horizontal switch MOS transistors 7 are sequentially turned ON, one row of image signal (electric signal) which is obtained by the change of the electrical properties is read out to the horizontal signal line 10 as a time series signal.

Next, the on voltage is applied to the next clock line 8 by the vertical scanning circuit 11. Then; one row of the vertical switch MOS transistors 6 connected to the clock line 8 achieves ON state. Subsequently, at this condition, when the horizontal switch MOS transistors 7 are sequentially turned ON, the row of image signal (electric signal) is read out to the horizontal signal line 10 as a time series signal. By repeating this operation, one screen of the image signal can be read out as the time series signal.

In such thermal type infrared radiation solid state image pick-up device, in order to enhance sensitivity of the light, it is required to reduce the flowing out of the heat from the photo receiving portion 2. FIG. 2 is a perspective view showing the conventional heat isolation structural body. As shown in FIG. 2, the heat isolation structural body 5 is formed with legs 3 at two edges. By these legs 3, the photo receiving portions 2 formed with the temperature-electric signal converting function element (not shown) are aerially supported. The heat isolation structural body 5 is formed of an insulation layer of a bulk, namely, silicon oxide layer and silicon nitride layer and so forth, and is constituted of about 0.5 $\mu$m of thin layer.

In the head isolation structural body 5 constructed as set forth above, in order to enhance the sensitivity in light reception, it is effective to reduce the flowing out of the heat from the photo receiving portion 2, namely to lower a thermal conductivity of the heat isolation structural body 5. Therefore, it is desirable to make the layer thickness of the bulk insulation layer as thin as possible to permit reduction of the sectional area of the legs 3 which determines flowing the out of heat from the photo sensitive portion 2.

However, when the bulk insulation layer forming the heat isolation structural body 5 is made thinner, a problem may be encountered in lowering of mechanical strength of the heat isolation structural body 5. Also, the heat isolation structural body 5 constituted of the bulk insulation layer may generate a residual stress upon formation. Accordingly, when the layer thickness of the insulation layer becomes thin to lower mechanical strength, the heat isolation structural body 5 may not maintain the configuration shown in FIG. 2 due to the presence of the residual stress to cause deformation. The heat isolation structural body 5 is normally formed so that a distance between a substrate supporting the heat isolation structural body 5 and a photo receiving portion 2 becomes ¼ of a center wavelength of used wave band. This is because infrared radiation absorption efficiency of the photo receiving portion 2 can be enhanced for optical resonation of the infrared radiation reflected from the substrate and the directly incident infrared radiation. However, as set forth above, if deformation is caused in the heat isolation structural body 5, the distance between the substrate and the photo receiving portion 2 does not satisfy the predetermined condition to lower infrared radiation absorption efficiency resulting in lowering of sensitivity.

SUMMARY OF THE INVENTION

Therefore, it is an object of the present invention to provide a thermal type infrared radiation solid state image pick-up device which can lower heat conductivity of a heat isolation structural body and increase mechanical strength to enhance photo sensitivity and reliability.

A thermal type infrared radiation solid state image pick-up device, according to the present invention, has a temperature-electrical signal converting function element for converting a temperature variation into an electrical signal. A heat isolation structural body supports the temperature-electrical signal converting function element and has a porous structure. An electronic scanning circuit element is connected to the temperature-electrical signal converting function element and outputs the electrical signal as a time series signal.

The heat isolation structural body may be formed of one of a silicon oxide layer or a silicon nitride layer. The temperature-electrical signal converting function element may be formed on a surface of the heat isolation structural body, or buried within the heat isolation structural body. In addition, it is possible that a plurality of the heat isolation structural bodies are arranged linearly or two-dimensionally.

The thermal type infrared radiation solid state image pick-up device may further have a substrate, and the heat isolation structural body may be formed on the substrate. In this case, it is preferred that the heat isolation structural body supports the temperature-electrical signal converting function element at a position away from the substrate. Also, the heat isolation structural body may include a photo receiving portion, in which the temperature-electrical signal converting function element is formed, and legs supporting the photo receiving portion on the substrate. Preferably, the legs are formed on a pair of mutually opposing edges of the photo receiving portion.

In the present invention, since the heat isolation structural body is formed with the porous structure with the porous layer, heat flowing out from the heat isolation structural body depends on an actual area derived by subtracting the area of the holes from the area of the cross-section of the leg (nominal cross section). On the other hand, a mechanical strength of the heat isolation structural body relies on or substantially relies upon the area of the cross section of the leg (nominal cross sectional area). Namely, the cross sectional area determining the heat flowing out becomes smaller than the cross sectional area determining the mechanical strength. Therefore, for obtaining the photo sensitivity equivalent to that of the conventional heat isolation structural body, the cross sectional area of the leg can be made greater to improve the mechanical strength thereof.

Also, in addition to the improvement of the mechanical strength of the heat isolation structural body, since the residual stress upon formation of the porous layer becomes substantially zero, deformation of the heat isolation structural body can be successfully prevented. Thus, the lowering of photo sensitivity can be successfully avoided.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed hereinafter in detail in terms of the preferred embodiment of the invention with reference to the accompanying drawings. In the following description, numerous specific details are set forth in order to provide a thorough understanding of the present invention. It will be obvious, however, to those skilled in the art that the present invention may be practiced without these specific details. In other instances, well-known structures are not shown in detail in order to unnecessary obscure the present invention.

Figure 1:
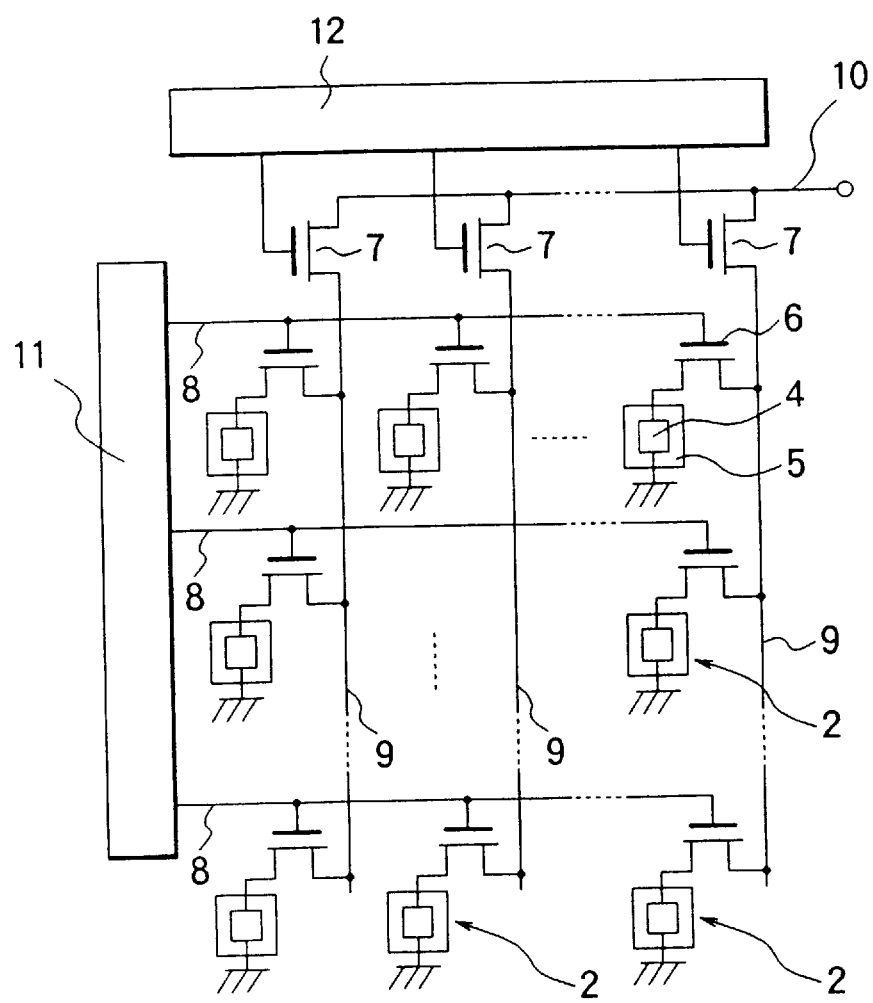
FIG. 1 is a block diagram showing a construction of a typical thermal type infrared radiation solid state image pick-up device.
Figure 2:
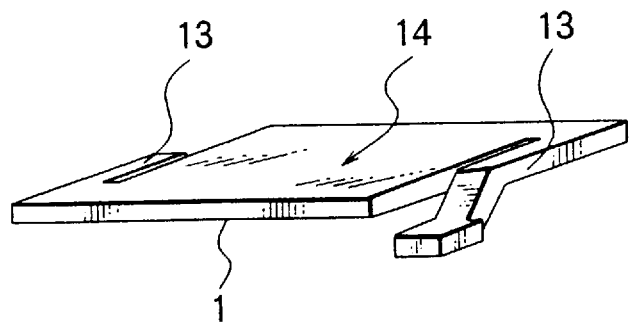
FIG. 2 is a perspective view showing the conventional heat isolation structural body.
Figure 3:
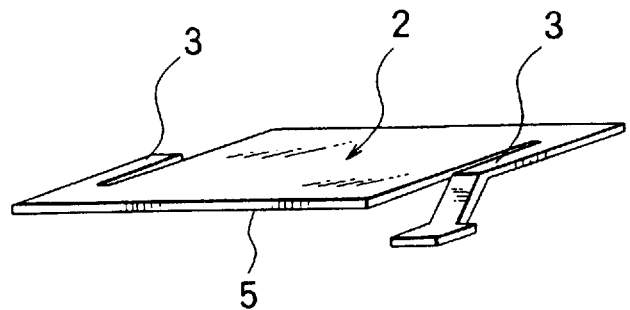
FIG. 3 is a perspective view showing a heat isolation structural body of the preferred embodiment of a thermal type infrared radiation solid state image pick-up device according to the present invention.

FIG. 3 is a perspective view showing a heat isolation structural body of the preferred embodiment of a thermal type infrared radiation solid state image pick-up device according to the present invention. As shown in FIG. 3, the heat isolation structural body 1 is formed with legs 13 at opposite two edges. With these legs 13, a photo receiving portion 14 with a temperature-electrical signal converting function element (not shown) is supported in a space. In the shown embodiment, the heat isolation structural body 1 has a porous structure.

The conventional heat isolation structural body is formed with a thin film of a bulk, a cross sectional area of the leg 3 determining flowing out of heat and the cross sectional area of the leg 3 determining mechanical strength are the same. In contrast to this, in the shown embodiment, since the heat isolation structural body 1 has a porous structure formed with a porous layer, the heat flowing out depends on an actual cross sectional area excluding the area of the holes from the area of the cross sectional shape of the leg 13 (nominal cross sectional area). On the other hand, the mechanical strength of the heat isolation structural body 1 depends on the area of the cross sectional shape of the leg 13 (nominal cross sectional area) or a value quite close to the nominal cross sectional area. Namely, the cross sectional area determining the heat flowing out becomes smaller than the cross sectional area determining the mechanical strength. Therefore, in the shown embodiment, for obtaining photo sensitivity equivalent to that of the conventional heat isolation structural body 5, the cross sectional area of the leg 13 can be made greater to increase mechanical strength of the heat isolation structural body 1.

In addition to the improvement of the mechanical strength of the heat isolation structural body 1, since the residual stress upon formation of the porous layer becomes close to zero, deformation of the heat isolation structural body 1 can be successfully prevented. Accordingly, the distance between the substrate (not shown) supporting the heat isolation structural body r and the photo receiving portion 14 can be maintained at a distance satisfying a condition for inducing optical resonation. Thus, lowering of photo sensitivity can be successfully prevented.

As a method for forming the heat isolation structural body 1 in porous structure, there is a method as set out below, for example. At first, on a silicon substrate, electronic scanning circuit element and its internal wiring and so forth are formed. Then, a protective layer having an effect for planing of the surface and protecting the elements formed on the surface of the substrate is formed. Then, in a reserved region for forming the pixels on the protective layer, a sacrificing layer of island form silicon oxide layer is formed. On the sacrificing layer, a polycrystalline silicon layer doped with boron to have boron concentration in a range of $1\times10^{16}$ to $1\times10^{21}$ $cm^{-3}$ is deposited. Then, a pattern of the heat isolation structural body is formed by photolithography. It should be noted that the boron doped polycrystalline silicon layer is patterned so that portions to be the legs of all of the heat isolation structural bodies are connected to each other and to contact with the peripheral portion of the silicon wafer. By this, the entire boron doped polycrystalline silicon layer in the shape of the heat isolation structural body is applied an electric power, or in the alternative, at least one of the portions to be the legs is electrically connected to the silicon substrate.

Thereafter, on the boron doped polycrystalline silicon layer, the temperature-electrical signal converting function element is formed. Also, further on the temperature-electrical signal converting function element, a silicon nitride layer is formed having a very thin layer. Thereafter, the sacrificing layer is removed by etching with hydrofluoric acid. Then, by an anodization method using hydrofluoric acid solution having HF solution concentration in a range of 20 to 50%, the boron doped polycrystalline silicon layer in the heat isolation structural body shape is formed into a porous structure. The sacrificing layer may be gradually etched off even by the anodization method. However, by removing the sacrificing layer by hydrofluoric acid, subsequent anodization process can be efficiently performed.

In the anodization process, it should be noted that when the heat isolation structural body becomes finally that made from silicon oxide ($SiO_2$), it is desirable to make the density of the boron doped polycrystalline silicon layer to be less than or equal to 44% through the anodization process. Also, when the heat isolation structural body becomes finally that made from silicon nitride ($Si_3N_4$), it is desirable to make the density of the boron doped polycrystalline silicon layer to be less than or equal to 80% through the anodization process. It should be noted that when the density of the boron doped polycrystalline silicon layer is set at 44% or 80%, most of the hole, are collapsed for volume expansion in oxidation or nitridation. However, even with such oxide layer or nitride layer, the residual stress upon formation is sufficiently smaller in comparison with the conventional bulk layer, and thus deformation of the heat isolation structural body 1 can be successfully prevented. For further enhancing photo sensitivity and improving strength, it is further desirable to make the density of the polycrystalline to be less than or equal to 22% before oxidation or less than, or to be less than or equal to 40% before nitridation so that the density of the layer can be about 50% after oxidation or nitridation.

After anodization process, the heat isolation structural body of porous structure can be formed by thermal oxidation of the boron doped polycrystalline silicon at a temperature in a range of 500° to 600 ° C. or by thermal nitridation at a temperature in a range of 700° to 800° C. utilizing ammonia gas. When thermal nitridation is selected, the process temperature becomes higher than the melting point of aluminum as a material primarily used as wiring material. Therefore, as the material for internal wiring, material having higher melting point, such as copper, gold, tungsten or so forth has to be selected instead of aluminum.

As another method for forming the porous heat isolation structural body, low pressure low temperature chemical vapor deposition method may be used. Similarly to the foregoing method, after forming the electronic scanning circuit element and its internal wiring and so forth, the protection layer for planing for the surface and protecting the elements are formed. Then, for the reserved regions for forming the pixels, the sacrificing layer of island shaped polycrystalline silicon layers are formed. Subsequently, on the sacrificing layer, silicon oxide ($SiO_2$) layer is deposited by low pressure low temperature chemical vapor deposition method utilizing monosilane and oxygen. At this time, instead of using the normally used growth temperature in a range of 300° to 500° C., the growth temperature is set in a range of 150° to 200° C., a silicon oxide layer of porous structure can be grown.

Thereafter, the porous silicon oxide layer is patterned into the shape of the heat isolation structural body. Then, on the silicon oxide layer, the temperature-electrical signal converting function element is formed. Thereafter, a very thin silicon oxide layer or silicon nitride layer is formed. Subsequently, the sacrificing layer of polycrystalline silicon is removed by etching to complete the formation of the heat isolation structural body.

Hereinafter, the shown embodiment of the thermal type infrared radiation solid state image pick-up device will be discussed. At first, on the substrate formed with the wiring and so forth, heat isolation structural body of porous silicon oxide layer and the temperature-electrical signal converting function element are formed to form the thermal type infrared radiation solid state image pick-up device. In the shown embodiment, the layer thickness of the porous silicon oxide layer is 0.5 $\mu$m and layer density is 50%. Subsequently, thermal conductivity from the heat isolation structural body and photo sensitivity of the photo receiving portion are measured. As a result, in comparison with the conventional heat isolation structural body having the equal layer thickness, the thermal conductivity was reduced to be about half, and the photo sensitivity was increased to be about double.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A thermal type infrared radiation solid state image pick-up device comprising:

a temperature-electrical signal converting function element for converting a temperature variation into an electrical signal;

a heat isolation structural body having a porous structure and a photo receiving portion, in which said temperature-electrical signal converting function element is formed, and legs supporting said photo receiving portion such that said photo receiving portion is raised by said legs; and an electronic scanning circuit element connected to said temperature-electrical signal converting function element and outputting said electrical signal as a time series signal.

2. A thermal type infrared radiation solid state image pick-up device as set forth in claim 1, wherein said heat isolation structural body is formed of one of a silicon oxide layer and a silicon nitride layer.

3. A thermal type infrared radiation solid state image pick-up device as set forth in claim 1, wherein said temperature-electrical signal converting function element is formed on a surface of said heat isolation structural body.

4. A thermal type infrared radiation solid state image pick-up device as set forth in claim 1, wherein said temperature-electrical signal converting function element is buried within said heat isolation structural body.

5. A thermal type infrared radiation solid state image pick-up device as set forth in claim 1, wherein a plurality of said heat isolation structural bodies are arranged linearly or two-dimensionally.

6. A thermal type infrared radiation solid state image pick-up device as set forth in claim 1, which further comprises a substrate on which said heat isolation structural body is formed.

7. A thermal type infrared radiation solid state image pick-up device as set forth in claim 6, wherein said heat isolation structural body supports said temperature-electrical signal converting function element at a position away from said substrate.

8. A thermal type infrared radiation solid state image pick-up device as set forth in claim 1, wherein said legs are formed on a pair of mutually opposing edges of said photo receiving portion.

\* \* \* \* \*